(12) United States Patent
Bang

(10) Patent No.: US 11,000,879 B2
(45) Date of Patent: May 11, 2021

(54) METHOD AND APPARATUS FOR TREATING SUBSTRATE

(71) Applicant: SEMES CO., LTD., Chungcheongnam-do (KR)

(72) Inventor: Byungsun Bang, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 533 days.

(21) Appl. No.: 15/603,188

(22) Filed: May 23, 2017

(65) Prior Publication Data
US 2017/0341106 A1 Nov. 30, 2017

(30) Foreign Application Priority Data
May 27, 2016 (KR) .................. 10-2016-0065843

(51) Int. Cl.
| | |
|---|---|
| *B05D 3/06* | (2006.01) |
| *H01L 21/67* | (2006.01) |
| *H01L 21/02* | (2006.01) |
| *B05C 9/14* | (2006.01) |
| *B05C 11/08* | (2006.01) |
| *B05C 11/10* | (2006.01) |

(Continued)

(52) U.S. Cl.
CPC ............ *B05D 3/065* (2013.01); *B05C 9/14* (2013.01); *B05C 11/08* (2013.01); *B05C 11/1002* (2013.01); *B05C 21/00* (2013.01); *B05D 3/0254* (2013.01); *B05D 3/10* (2013.01); *H01L 21/02057* (2013.01); *H01L 21/67028* (2013.01); *H01L 21/67051* (2013.01); *H01L 21/67115* (2013.01); *B05D 1/005* (2013.01); *B05D 3/0218* (2013.01); *B05D 3/067* (2013.01); *B05D 3/104* (2013.01); *B05D 5/08* (2013.01)

(58) Field of Classification Search
None
See application file for complete search history.

(56) References Cited

U.S. PATENT DOCUMENTS

| | | | | |
|---|---|---|---|---|
| 2008/0274282 | A1* | 11/2008 | Bent | ................. C23C 16/04 427/255.28 |
| 2012/0077045 | A1 | 3/2012 | Smith et al. | |
| 2014/0060575 | A1* | 3/2014 | Lee | ........... H01L 21/02057 134/4 |

FOREIGN PATENT DOCUMENTS

| | | |
|---|---|---|
| CN | 103681236 A | 3/2014 |
| CN | 103854987 A | 6/2014 |

(Continued)

OTHER PUBLICATIONS

China Patent Office, Office action dated Dec. 26, 2019.

*Primary Examiner* — Shamim Ahmed
*Assistant Examiner* — Bradford M Gates
(74) *Attorney, Agent, or Firm* — Li & Cai Intellectual Property (USA) Office

(57) ABSTRACT

Provided is a method and apparatus for treating a substrate with a liquid. The substrate treating method comprises a pre-treating step for supplying the treatment liquid containing hydrogen fluoride (HF) to the substrate and treating the substrate before the surface modification step and a surface modification step for supplying an alkene-based chemical onto a substrate to change the surface of the substrate to a hydrophobic state. As a result, the surface of the substrate is uniform, and generation of particles can be reduced when the substrate is removed.

5 Claims, 5 Drawing Sheets

(51) Int. Cl.
  *B05C 21/00*   (2006.01)
  *B05D 3/02*   (2006.01)
  *B05D 3/10*   (2006.01)
  *B05D 5/08*   (2006.01)
  *B05D 1/00*   (2006.01)

(56) References Cited

FOREIGN PATENT DOCUMENTS

| | | |
|---|---|---|
| JP | 2000-195835 A | 7/2000 |
| JP | 2010-153773 A | 7/2010 |
| KR | 10-0686780 B1 | 2/2007 |
| KR | 10-2014-0029095 A | 3/2014 |
| KR | 10-2014-0143331 A | 12/2014 |
| KR | 10-2012-0109345 A | 11/2015 |
| KR | 10-2015-0127677 A | 11/2015 |

\* cited by examiner

METHOD AND APPARATUS FOR TREATING SUBSTRATE

CROSS-REFERENCE TO RELATED APPLICATIONS

A claim for priority under 35 U.S.C. § 119 is made to Korean Patent Application No. 10-2016-0065843 filed May 27, 2016, in the Korean Intellectual Property Office, the entire contents of which are hereby incorporated by reference.

BACKGROUND OF THE INVENTION

The present invention disclosed herein relates to a method and a apparatus for treating substrate with liquid.

In order to manufacture a semiconductor device or a liquid crystal display, various processes such as photolithography, ashing, etching, ion implantation, thin film deposition, and cleaning are performed on the substrate. From this kind of substrate treating process, a pattern may be formed on the substrate, and the formed pattern may be collapsed by the atmosphere or water. In order to prevent the collapse of the pattern, a step of changing the surface of the substrate from hydrophilic to hydrophobic (hereinafter, surface modification step) is performed.

Generally, in the surface modification process, a substrate having a hydrophilic surface is bonded to a silyl or hydroxyl group to modify the surface to be hydrophobic. Such a surface modification step should be performed sequentially in a first rinsing step, a first replacement step, a surface modification step, a second replacement step, a second rinsing step, and a drying step.

This requires rinsing and replacement steps before and after the surface modification step, respectively, and it takes a lot of time since the rinsing step and the replacement step are repeated. In addition, when the surface of a substrate is modified with a chemical containing a silyl or hydroxyl group, the surface of the substrate is uneven, and when removing this, a large amount of particles are generated.

SUMMARY OF THE INVENTION

Embodiments of the inventive concept described herein relate to a method and apparatus capable of uniformly modifying the surface of a substrate.

Embodiments of the inventive concept described herein relate to a method and apparatus for minimizing the generation of large quantities of particles during hydrophilic modification of a hydrophobic surface of a substrate.

Embodiments of the inventive concept described herein relate to a method and apparatus for treating a substrate with a liquid. The substrate treating method comprises a surface modification step for supplying an alkene-based chemical onto a substrate to change the surface of the substrate to a hydrophobic state.

The substrate treating method further comprises a pretreating step for supplying the treatment liquid containing hydrogen fluoride (HF) to the substrate and treating the substrate before the surface modification step. In the surface modification step, the chemical may be radically reacted with the surface of the substrate. The radical reaction may be generated by irradiating the substrate with ultraviolet light.

The radical reaction may be generated by heating the substrate.

The temperature of the substrate may be 200° C. or less, and the treating time of the surface modification step may be within 2 minutes. A rinsing step for supplying a rinsing liquid to the substrate and treating the substrate after the surface modification step and a replacement step for supplying an organic solvent to the substrate after the rinsing step to replace the rinsing liquid remaining on the substrate may be further comprised.

The substrate treating apparatus further comprises a substrate support unit for supporting the substrate and a liquid supply unit for supplying the substrate support unit with liquid, wherein the liquid supply unit includes a chemical nozzle for supplying an alkene series chemical onto a substrate so that the surface of the substrate is changed to be hydrophobic.

The liquid supply unit further comprises a pretreatment nozzle for discharging a treatment liquid containing hydrogen fluoride (HF), and a controller for controlling the chemical nozzle and the treatment nozzle, wherein the controller may control the chemical nozzle and the treatment nozzle to supply a treatment liquid onto the substrate and then supply the chemical. The liquid supply unit may further include a heater for heating the substrate supported by the substrate support unit. The liquid supply unit may further include a lamp for irradiating ultraviolet (UV) light onto the substrate supported by the substrate support unit.

According to an embodiment, the surface modification process of the substrate is performed by treating the substrate with a treatment liquid containing hydrogen fluoride (HF), and thereafter modifying the surface of the substrate to a hydrophobic property with an alkene series chemical. As a result, the surface of the substrate is uniform, and generation of particles can be reduced when the substrate is removed.

According to an embodiment, in the surface modification step of the substrate, heating or ultraviolet rays are irradiated, and the degree of hydrophobicity can be controlled by controlling the temperature and the process time of the substrate.

DETAILED DESCRIPTION

Various example embodiments will be described more fully hereinafter with reference to the accompanying drawings, in which some example embodiments are shown. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Therefore, features of the drawings are exaggerated to emphasize definite explanation.

In the embodiment, a process of cleaning a hydrophobic film formed on a substrate will be described as an example. Hereinafter, an example of the present invention will be described in detail with reference to FIGS. 1 to 7.

Figure 1:
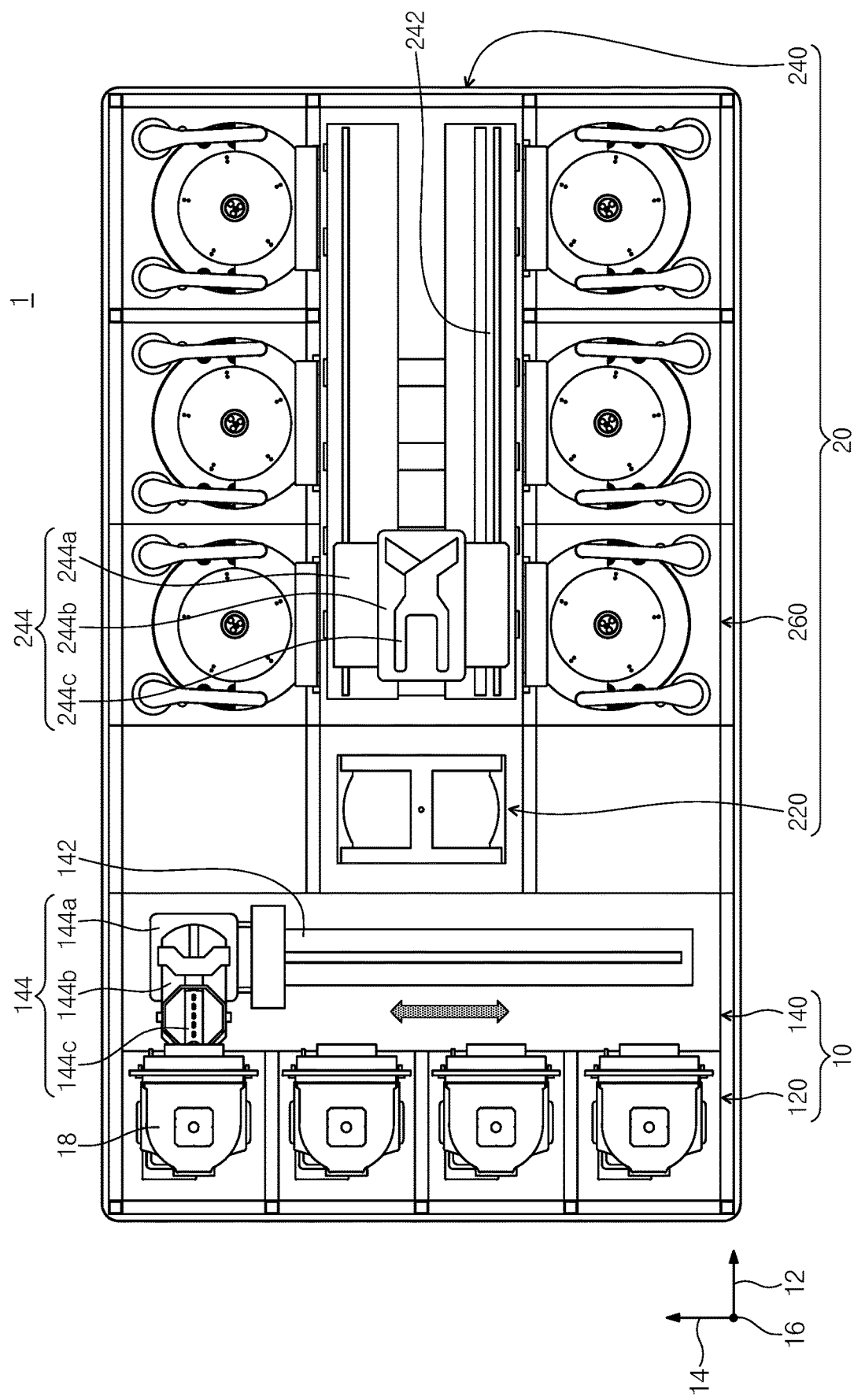
FIG. 1 is a plan view showing a substrate treating apparatus according to an embodiment of the present invention.

FIG. 1 is a plan view showing a substrate treating apparatus according to an embodiment of the present invention.

Referring to FIG. 1, a substrate treating apparatus 1 comprises an index module 10 and a process treating module 20. The index module 10 have a load port 120 and a transfer frame 140. The load port 120, the transfer frame 140, and the process treating module 20 are sequentially arranged in a row. Hereinafter, a direction where the load port 120, the transfer frame 140, and the process treating module are arranged is referred to as a first direction 12. And a direction perpendicular to the first direction 12 is referred to as a second direction 14, when view from a top side, and a direction perpendicular to a plane including the first direction 12 and the second direction 14 is referred to as a third direction 16.

A carrier 18 where a substrate W is stored is seated on the load port 120. The load port 120 is provided as a plurality of numbers and they are arranged in a row along the second direction 14. The number of load ports 120 may be increased or decreased depending on a requirement like process efficiency and a footprint of the process treating module 20. The carrier 18 is formed with a plurality of slots (not shown) for accommodating the substrates W horizontally with respect to the plane surface. A front opening unified pod (FOUP) may be used as the carrier 18.

The process treating module 20 comprises a buffer unit 220, a transfer chamber 240, and a process chamber 260. The transfer chamber 240 is provided such that the lengthwise direction thereof is parallel with the first direction 12. Process chambers 260 are disposed on both sides of the transfer chamber 240, respectively. On both sides of the transfer chamber 240, the process chambers 260 are positioned symmetrically with respect to the transfer chamber 240. Some of the process chambers 260 are placed along the lengthwise direction of the transfer chamber 240. Also, some of the process chambers 260 are placed vertically stacked to each other. That is, in one side of the transfer chamber 240, the process chambers 260 may be arranged in A×B array. Herein, A is the number of the process chambers 250 which are provided along the first direction 12, and B is the number of process chambers 260 which are provided along the third direction 16. When four or six process chambers 260 are provided on one side of the transfer chamber 240, the process chambers 260 may be arranged in 2×2 or 3×2 arrays. The number of the process chamber 260 may be increased or decreased.

Selectively, the process chamber 260 may be provided only on one side of the transfer chamber 240. Also, the process chamber 260 may be provided as a single layer at both sides of the transfer chamber 240.

The buffer unit 220 is arranged between the transfer frame 140 and the transfer chamber 240. The buffer unit provides a space for the substrate W to stay temporarily before transferring the substrate W between the transfer chamber 240 and the transfer frame 140. The slot (not described) where the substrate places is provided inside (e.g., inner wall) of the buffer unit 220, and the slots (not described) are provided with a plurality of numbers spaced apart from each other along the third direction 16. One side of the buffer unit 220 facing the transfer frame 140, and the other side of the buffer unit 220 facing the transfer chamber 240 are opened.

The transfer frame 140 transfers the substrate W between the buffer unit 220 and the carrier 18 seated on the load port 120. In the transfer frame 140, an index rail 142 and an index robot 144 are provided. The index rail 142 is provided such that the lengthwise direction is parallel to the second direction 14. The index robot 144 is installed on the index rail 142, and move linearly along the index rail 142 to the second direction 14. The index robot 144 comprises a base 144a, a body 144b, and an index arm 144c. The base 133a is installed movably along the index rail 142. The body 144b is coupled to the base 144a. The body 144b is provided movably along the third direction 16 on the base 144a. Also, the body 144b is provided rotatable on the base 144a. The index arm 144c is coupled to the body 144b, and is provided to move front and back to the body 144b. The index arm 144c is provided with a plurality of numbers and they are driven independently. The index arms 144c are arranged vertically, i.e., spaced apart from each other along the third direction 16. Some of the index arms 144c may be used when transferring the substrate W from the process treating module 20 to the carrier 18, and some may be used when transferring the substrate W from the carrier 18 to the process treating module 200. In this way, during the index robot 144 carries in or carries out the substrate W, particles that have come from a substrate before treating process may be prevented from adhering to a substrate after treating process.

The transfer chamber 240 transfers the substrate W between process chambers 260 and the buffer unit 220 and between the process chambers 260. A guide rail 242 and a main robot 244 are provided in the transfer chamber 240. The guide rail 242 is places such that the lengthwise direction is parallel with the first direction 12. The main robot 244 is installed on the guide rail 242, and moves linearly along the first direction 12 on the guide rail 242. The main robot 244 comprises a base 244a, a body 244b, and a main arm 244c. The base 244a is installed movably along the guide rail 242. The body 244b is coupled to the base 244a. The body 244b is provided movably along the third direction 16 on the base 244a. Also, the body 244b is provided rotatable on the base 244a. The main arm 244c is coupled to the body 244b, and is provided to move front and back to the body 244b. The main arm 244c is provided with a plurality of numbers and they are provided to drive separately. The main arms 244c are arranged vertically, i.e., spaced apart from each other along the third direction 16.

In the process chamber 260, a substrate treating apparatus 300 which performs a cleaning process to the substrate W is provided. The substrate treating apparatus 300 may have different structure based on kinds of cleaning process. The substrate treating apparatus 300 provided in each process chambers 240 may have the same structure. Selectively, the substrate treating apparatus 300 provided in the same group of the process chamber 260 may have the same structure, and the substrate treating apparatus 300 provided in different group of the process chamber 260 may have different structure.

Figure 2:
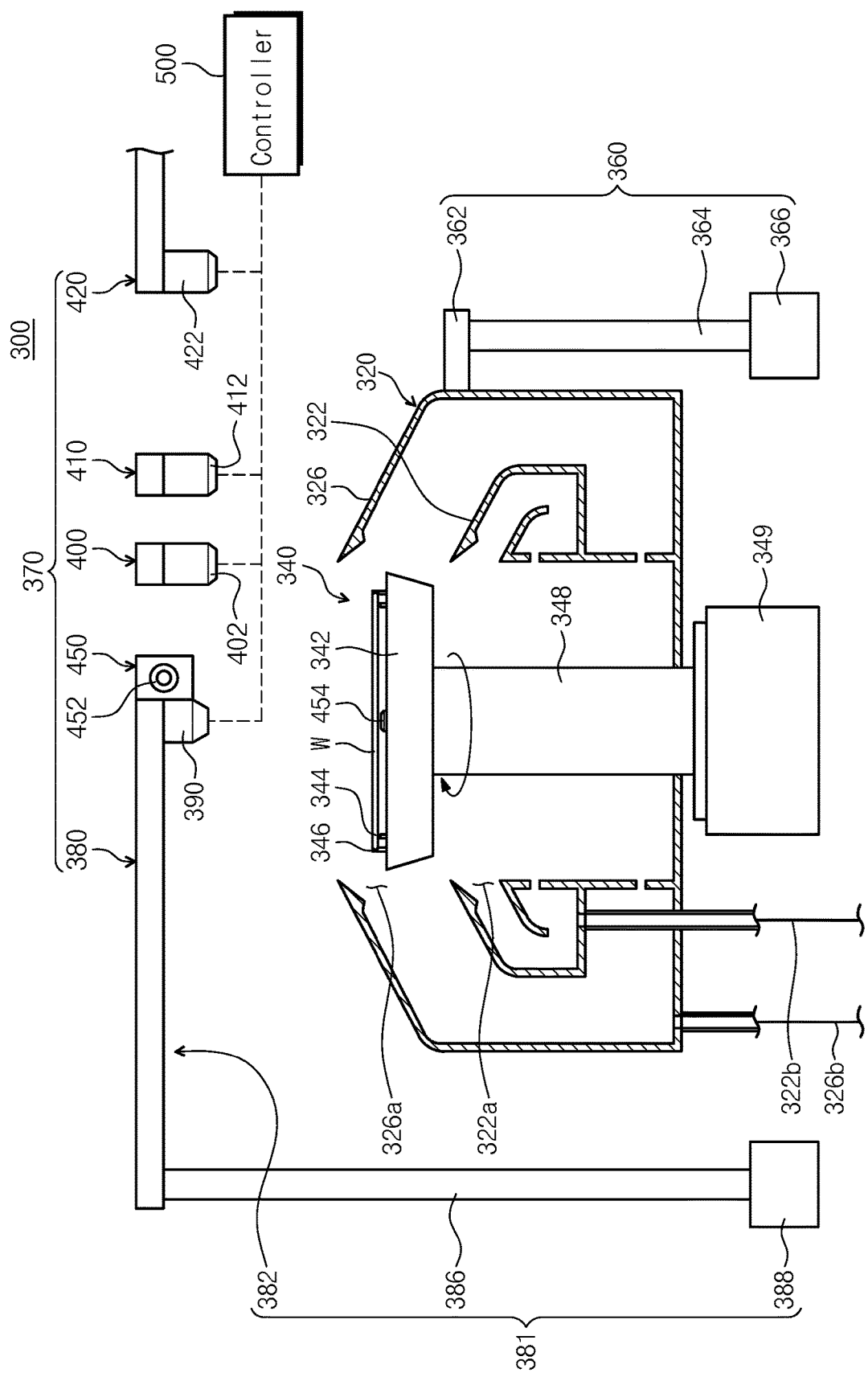
FIG. 2 is a cross-sectional view showing the substrate treating apparatus of FIG. 1.

The substrate treating apparatus 300 performs a process of modifying and cleaning the surface of the substrate. FIG. 2 is a cross-sectional view showing the substrate treating apparatus of FIG. 1. Referring to FIG. 2, the substrate treating apparatus 300 comprises a treatment container 320, a spin head 340, an elevating unit 360, a liquid supply unit 370, and a controller 500.

The treatment container 320 provides a treating space where a substrate treating process is performed. The treatment container 320 has open upper side. The treatment container 320 comprises an inner collecting container 322, and an outer collecting container 326. Each collecting containers 322, 324, 326 collects a treatment liquid that are different from each other among treatment liquids used in a process. The inner collecting container 322 is provided as a ring shape surrounding the spin head 340. The outer collecting container 326 is provided as a ring shape surrounding the inner collecting container 322. An inner space 322a of the inner collecting container 322 and an interspace 326a between the inner collecting container 322 and the outer collecting container 326 may function as a inlet where treatment liquid flows into the inner collecting container 322 and the outer collecting container 326, respectively. According to an embodiment, each inlet 322a, 326a may be placed in different heights from each other. Collecting lines 322b, 326b are connected to the bottom side of inlets 322, 326 respectively. Treatment liquid that flew into each inlet 322, 326 may be reused through the collecting line 322b, 326b as treatment liquid regeneration system (not shown) of outside.

The spin head 340 is provided as a substrate support unit 320 that rotates and supports the substrate W during process. The spin head 340 has a body 342, a supporting pin 344, a chuck pin 346, and a supporting shaft 348. When viewed from the top, the body 342 is generally provided such that an upper surface of the top body 342 is provided as a circular shape. The rotatable supporting shaft 348 is fixedly connected to the bottom side of the body 342 driven by a driving part 349.

The supporting pin 344 is provided as plurality number. The plurality of supporting pins 344 are provided and spaced apart from each other on edge of the upper surface of the body 342 and protrude upward from the body 342. The supporting pins 344 are generally arranged to have a ring shape. The supporting pin 344 supports the back side of the substrate W to be spaced apart from the upper surface of the body 342.

The chuck pin 346 is provided as plurality number. The chuck pin 436 is arranged further apart from a center of the body 342 than the supporting pin 344. The chuck pin 436 is provided as to protrude upward from the body 342. The chuck pin 436 supports lateral part of the substrate W to make substrate W not deviate from a right position to a side direction when the spin head 340 is rotating. The chuck pin 346 is provided to move linearly between standby position and supporting position along a radius direction of the body 342. The standby position is further apart from a center of the body 342 than the supporting position. When loading and unloading the substrate W from the spin head 340 the chuck pin 346 is placed on the standby position, and when processing the substrate W, the chuck pin 346 is placed on the supporting position. The chuck pin 346 on the supporting position is contacted with the lateral part of the substrate.

The elevating unit 360 moves the treatment container 320 linearly up and down direction. As the treatment container 320 moves up and down direction, relative height of the treatment container 320 changes with respect to the spin head 340. The elevating unit 360 has a bracket 362, a moving shaft 364, and a driver 366. The bracket 362 is fixedly connected to an outer wall of the treatment container 320, and the moving shaft 364 which moves to up and down direction by the driver 366 is fixedly connected to the bracket 362. When the substrate is placed on the spin head 340 or when lifted from the spin head 340, the treatment container 320 descends such that the spin head 340 protrudes upward from the treatment container 320. Also, during processing, the height of the treatment container 320 are controlled such that treatment liquid flows into the predetermined collecting container 360 depending on a kind of treatment liquid supplied in substrate W. Selectively, the elevating unit 360 may move the spin head 340 up and down direction.

The liquid supply unit 370 supplies treatment liquid to the substrate W. The liquid supply unit 370 includes a chemical member 380, a pretreatment member 400, a rinsing member 410, a replacement member 420, an irradiation member 450, and a controller 500.

The chemical member 380 supplies the chemical on the substrate W. The chemical member 380 includes a nozzle moving member 381 and a chemical nozzle 390. The nozzle moving member 381 moves the chemical nozzle 390 to the process position and the standby position. The process position is the position where the chemical nozzle 390 is opposed to the substrate W supported on the substrate support unit 340, and the standby position is the position at which the chemical nozzle 390 is out of the process position. The nozzle moving member 381 includes a support shaft 386, a support arm 382, and a driving member 388. The support shaft 386 is located on one side of the treatment container 320. The support shaft 386 has a rod shape whose longitudinal direction faces the third direction. The support shaft 386 is provided to be rotatable by the driving member 388. The support arm 382 is coupled to the upper end of the support shaft 386. The support arm 382 extends vertically from the support shaft 386. A chemical nozzle 390 is fixedly coupled to an end of the support arm 382. As the support shaft 386 rotates, the chemical nozzle 390 is swingable with the support arm 382. The chemical nozzle 390 can be swung and moved to the process position and the standby position. The chemical nozzle 390 may be positioned to coincide with the central axis of the substrate W in the process position. For example, the chemical may be an alkene-based liquid. The chemical may be 6 to 20 carbons (C) composed of double bonds.

Alternatively, the support shaft 386 may be provided so as to be movable up and down. Also, the support arm 382 can be provided so as to be movable forward and backward in the longitudinal direction thereof.

The pretreatment member 400 supplies the treatment liquid onto the substrate W. The pretreatment member 400 includes a nozzle moving member and a pretreatment nozzle 402. The nozzle moving member of the pretreatment member 400 has the same shape as the nozzle moving member 381 of the chemical member 380 described above. Thereby, a detailed description thereof will be omitted. For example, the treatment liquid may be a liquid containing hydrogen fluoride (HF).

The rinsing member 410 supplies the rinsing liquid onto the substrate W. The rinsing member 410 includes a nozzle moving member and a rinsing nozzle 412. The nozzle moving member of the rinsing member 410 has the same shape as the nozzle moving member 381 of the chemical member 380 described above. A detailed description thereof will be omitted. For example, the rinsing liquid may be pure.

The replacement member 420 supplies the organic solvent onto the substrate W. The rinsing liquid remaining on the substrate W can be replaced with an organic solvent. The replacement member 420 includes a nozzle moving member and a replacement nozzle 422. The nozzle moving member of the replacement member 420 has the same shape as the nozzle moving member 381 of the chemical member 380 described above. A detailed description thereof will be omitted. For example, the organic solvent may be an isopropyl alcohol (IPA) solution.

The irradiation member 450 induces a radical reaction between the substrate W and the chemical. The irradiation member 450 heats the substrate W. The irradiation member 450 includes a lamp 452 and a heater 454. The lamp 452 irradiates light at the top of the substrate W. The lamp 452 is installed in the chemical nozzle 390. The lamp 452 is located at one side of the chemical nozzle 390. According to one example, the light may comprise ultraviolet (UV) radiation.

The heater 454 heats the substrate W supported by the substrate support unit 340. The heater 454 is positioned opposite to the non-treated surface of the substrate W. Herein, the non-treated surface of the substrate W corresponds to the bottom surface of the substrate W. The heater 454 is installed on the upper surface of the spin head 342. For example, the heater 454 may generate heat at room temperature to 200° C. Alternatively, the heater 454 may be disposed on the other side of the chemical nozzle 390 and positioned opposite the upper surface of the substrate W.

The controller 500 controls the pretreatment nozzle 402, the chemical nozzle, the rinsing nozzle 412, the replacement nozzle 422, and the irradiation member 450 so that the pre-treating step S10, the surface modification step S20, the rinsing step S30, and the replacement step S40 are sequentially performed. In the pretreatment step S10, the substrate W is treated with a treatment liquid, and in the surface modification step S20, the substrate W is treated with a chemical. In the rinsing step S30, the substrate W is treated with a rinsing liquid, and in the replacement step S40, the substrate W is treated with an organic solvent. The controller 500 irradiates light in the surface modification step S20 and controls the irradiation member 450 so that the substrate W is heated. Selectively, the controller 500 may control to operate either the heating of the substrate W or the light irradiation in the surface modification step S20.

Figure 3:
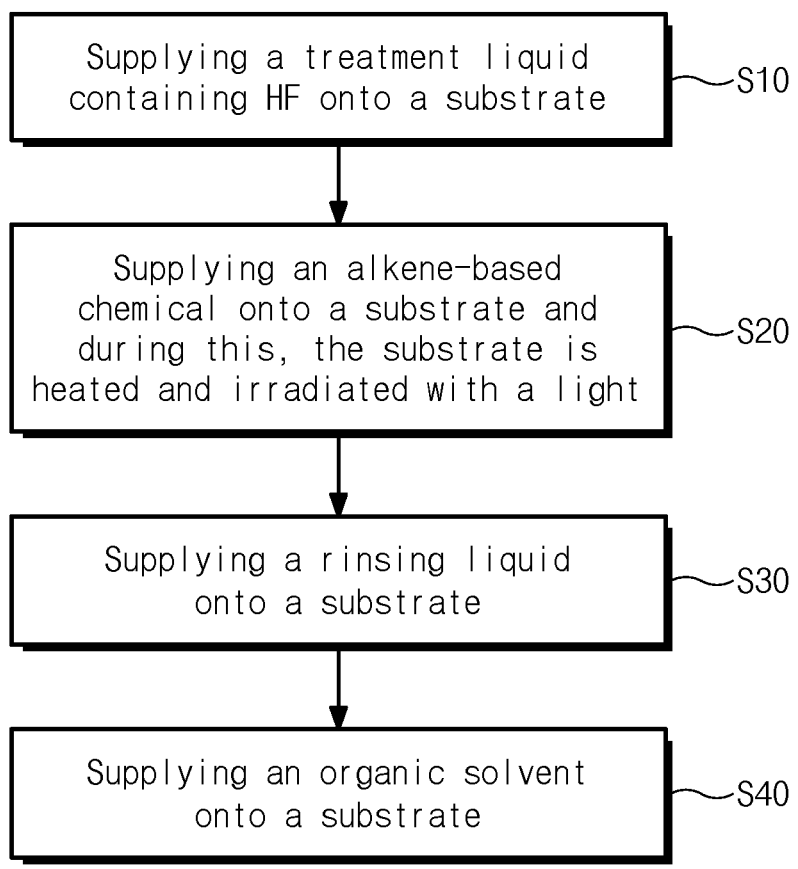
FIG. 3 is a flowchart illustrating a process of treating a substrate using the substrate treating apparatus of FIG. 2.
Figure 4:
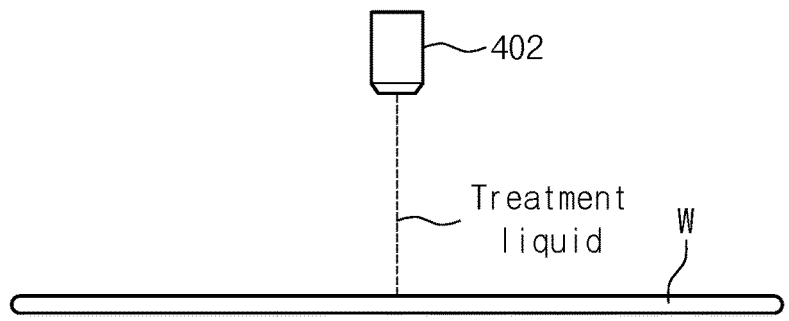
FIGS. 4 to 7 are views illustrating a process of treating a substrate using the liquid supply unit of FIG. 2.
Figure 5:
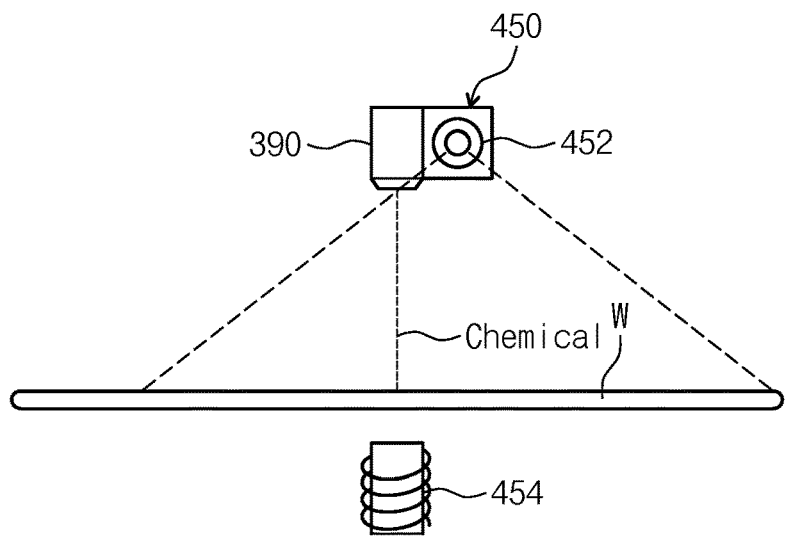
Figure 6:
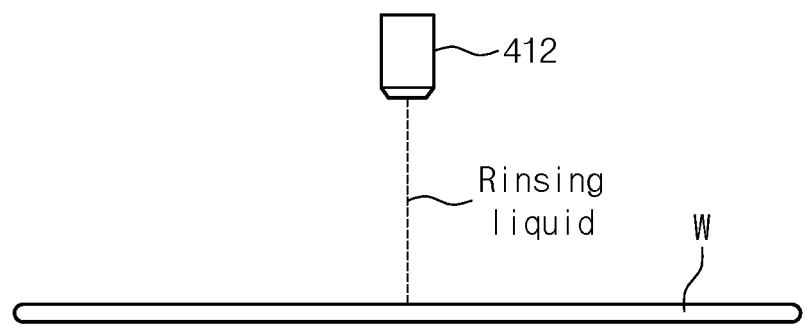
Figure 7:
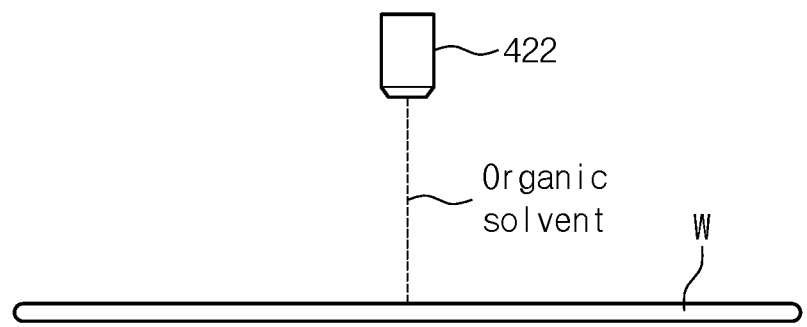

A process of treating the substrate W using the above described substrate treating apparatus 300 will be described. As described above, the pre-treating step S10, the surface modification step S20, the rinsing step S30, and the replacement step S40 are sequentially performed. FIG. 3 is a flowchart illustrating a process of treating a substrate using the substrate treating apparatus of FIG. 2. FIGS. 4 to 7 are views illustrating a process of treating a substrate using the liquid supply unit of FIG. 2.

When the pre-treating step S10 is performed, the pretreatment nozzle 402 is moved to the process position to supply the treatment liquid onto the substrate W. The surface of the substrate W is subjected to a reaction treatment with a treatment liquid containing hydrogen fluoride (HF). When the pre-treating step S10 is completed, the pretreatment nozzle 402 is moved to the standby position, and the surface modification step S20 is performed.

As the surface modification step S20 proceeds, the chemical nozzle is moved to the process position to supply the chemical on the substrate W. During the surface modification step S20, the substrate W is heated by the heater 454 and the surface of the substrate W is irradiated with light. Accordingly, the chemical reacts with the surface of the W by a radical reaction and forms a hydrophobic film on the upper surface of the substrate W. A degree of the hydrophobic film formed on the substrate W is proportional to the heating temperature and the processing time of the substrate W. That is, the degree of the hydrophobic film increases as the heating temperature is higher and the process time of the surface modification step S20 is longer. When the surface modification step S20 is completed, the chemical nozzle 390 is moved to the standby position and the rinsing step S30 proceeds. According to an example, the surface modification step S20 may be within 2 minutes.

When the rinsing step S30 is performed, the rinsing nozzle 412 is moved to the process position to supply the rinsing liquid onto the substrate W. The rinsing liquid rinses the chemical or particles remaining on the substrate W. When the rinsing step S30 is completed, the rinsing nozzle 412 is moved to the standby position, and the replacement step S40 proceeds.

When the replacement step S40 proceeds, the replacement nozzle 422 is moved to the process position to supply the organic solvent onto the substrate W. The rinsing liquid remaining on the substrate W is replaced with an organic solvent. When the replacement step S40 is completed, a drying step for removing the organic solvent remaining on the substrate W may be further performed. In the drying step, an inert gas may be supplied onto the substrate W, or may be supercritically treated and dried.

What is claimed is:

1. A method for treating a substrate to change a surface of the substrate from a hydrophilic state to a hydrophobic state, comprising:
    a pre-treating step for supplying a treatment liquid containing hydrogen fluoride (HF) to the substrate and treating the substrate;
    a surface modification step for supplying an alkene-based chemical onto a substrate after the pre-treating step to change the surface of the substrate from the hydrophilic state to the hydrophobic state;
    a rinsing step for supplying a rinsing liquid to the substrate and treating the substrate after the surface modification step; and
    a replacement step for supplying an organic solvent to the substrate after the rinsing step to replace the rinsing liquid remaining on the substrate.
2. The method of claim 1, wherein in the surface modification step, the chemical radically reacts with the surface of the substrate.
3. The method of claim 2, wherein the radical reaction is generated by irradiating the substrate with ultraviolet light.
4. The method of claim 2, wherein the radical reaction is generated by heating the substrate.
5. The method of claim 3, wherein a temperature of the substrate is 200° C. or less, and a treating time of the surface modification step is within 2 minutes.

* * * * *